United States Patent
Stay et al.

(10) Patent No.: US 10,537,028 B2
(45) Date of Patent: Jan. 14, 2020

(54) METALLIC MICROSTRUCTURES WITH REDUCED-VISIBILITY AND METHODS FOR PRODUCING SAME

(71) Applicant: 3M INNOVATIVE PROPERTIES COMPANY, St. Paul, MN (US)

(72) Inventors: Matthew S. Stay, Minneapolis, MN (US); Matthew R. Smith, Woodbury, MN (US); Mikhail L. Pekurovsky, Bloomington, MN (US); John T. Strand, Stillwater, MN (US); Moses M. David, Woodbury, MN (US); Glen A. Jerry, Blaine, MN (US); Ellison G. Kawakami, St. Paul, MN (US); Karl K. Stensvad, Inver Grove Heights, MN (US); James R. Starkey, Menomonie, WI (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 128 days.

(21) Appl. No.: 15/320,016

(22) PCT Filed: Jun. 26, 2015

(86) PCT No.: PCT/US2015/037929
§ 371 (c)(1),
(2) Date: Dec. 19, 2016

(87) PCT Pub. No.: WO2016/003792
PCT Pub. Date: Jan. 7, 2016

(65) Prior Publication Data
US 2017/0142841 A1    May 18, 2017

Related U.S. Application Data

(60) Provisional application No. 62/018,717, filed on Jun. 30, 2014.

(51) Int. Cl.
*G06F 3/041* (2006.01)
*H05K 3/06* (2006.01)
(Continued)

(52) U.S. Cl.
CPC ............ *H05K 3/048* (2013.01); *G06F 3/041* (2013.01); *H05K 1/028* (2013.01); *H05K 1/0274* (2013.01);
(Continued)

(58) Field of Classification Search
CPC ...... H05K 3/048; H05K 1/0274; H05K 1/028; H05K 3/06; H05K 3/22; H05K 2201/0108;
(Continued)

(56) References Cited

U.S. PATENT DOCUMENTS 4,080,513 A * 3/1978 Cuneo ................. H05K 3/107
174/255
4,711,822 A * 12/1987 Choyke ................. H05K 1/056
205/126
(Continued)

FOREIGN PATENT DOCUMENTS

| CN | 103220884 A | 7/2013 |
| CN | 103547984 A | 1/2014 |

(Continued)

OTHER PUBLICATIONS

Inagaki, "Surface Characterization of Plasma-Modified Poly (ethylene terephthalate) Film Surfaces", Journal of Polymer Science: part B: Polymer Physics, 2004, vol. 42, pp. 3727-3740.
(Continued)

*Primary Examiner* — Andargie M Aychillhum
*Assistant Examiner* — Michael F McAllister
(74) *Attorney, Agent, or Firm* — Yufeng Dong (57) ABSTRACT

Electrically conductive patterns formed on a substrate are provided with a reduced visibility. A region of a major
(Continued)

surface of the substrate is selectively roughened to form a roughened pattern on the major surface of the substrate. Electrically conductive traces are directly formed on the roughened region and are conformal with the roughened pattern on the major surface of the substrate.

13 Claims, 5 Drawing Sheets

(51) Int. Cl.
*H05K 3/22* (2006.01)
*H05K 3/04* (2006.01)
*H05K 1/02* (2006.01)

(52) U.S. Cl.
CPC ............... *H05K 3/06* (2013.01); *H05K 3/22* (2013.01); *G06F 2203/04103* (2013.01); *G06F 2203/04112* (2013.01); *H05K 2201/0108* (2013.01); *H05K 2203/11* (2013.01)

(58) Field of Classification Search
CPC . H05K 2201/09681; H05K 2203/0108; H05K 2203/095; H05K 2203/11; G06F 3/041; G06F 3/044; G06F 2203/04103; G06F 2203/04112
USPC .......................................................... 174/250
See application file for complete search history.

(56) References Cited

U.S. PATENT DOCUMENTS

| | | | |
|---|---|---|---|
| 5,691,846 A | 11/1997 | Benson, Jr. | |
| 6,141,870 A * | 11/2000 | McDermott | H05K 3/10 29/852 |
| 6,309,580 B1 | 10/2001 | Chou | |
| 6,640,434 B1 | 11/2003 | Wojewnik et al. | |
| 7,215,393 B2 | 5/2007 | Kawaguri | |
| 7,291,380 B2 * | 11/2007 | Nyholm | C23C 18/22 174/257 |
| 8,634,146 B2 | 1/2014 | David | |
| 2012/0194441 A1 | 8/2012 | Frey | |
| 2012/0327021 A1 | 12/2012 | Ryu et al. | |
| 2013/0058062 A1* | 3/2013 | Tachibana | H01L 23/49827 361/783 |
| 2013/0092428 A1* | 4/2013 | Kawaguchi | H05K 1/0218 174/262 |
| 2013/0299214 A1 | 11/2013 | Frey | |
| 2014/0054753 A1 | 2/2014 | Liu | |
| 2014/0085551 A1 | 3/2014 | Koo et al. | |
| 2014/0131067 A1 | 5/2014 | Liu et al. | |
| 2015/0034590 A1* | 2/2015 | Takahashi | H05K 3/067 216/20 |
| 2015/0075847 A1* | 3/2015 | Liao | C25D 7/123 174/255 |
| 2015/0223328 A1* | 8/2015 | Endoh | B32B 7/02 345/174 |

FOREIGN PATENT DOCUMENTS

| | | |
|---|---|---|
| EP | 2639798 A1 | 9/2013 |
| JP | 11-260271 | 9/1999 |
| JP | 2000-58748 | 2/2000 |
| KR | 10-1275860 | 6/2013 |
| TW | 201244945 A | 11/2012 |
| WO | WO 2003-105248 | 12/2003 |
| WO | WO 2006/006724 A1 | 1/2006 |

OTHER PUBLICATIONS

International Search Report for PCT International Application No. PCT/US2015/037929 dated Oct. 8, 2015, 3 pages.

\* cited by examiner

METALLIC MICROSTRUCTURES WITH REDUCED-VISIBILITY AND METHODS FOR PRODUCING SAME

CROSS REFERENCE TO RELATED APPLICATIONS

This application is a national stage filing under 35 U.S.C. 371 of PCT/US2015/037929, filed Jun. 26, 2015, which claims the benefit of U.S. Application No. 62/018,717, filed Jun. 30, 2014, the disclosure of which is incorporated by reference in its/their entirety herein.

TECHNICAL FIELD

The present disclosure relates to articles having electrically conductive patterns with reduced-visibility and methods of forming the same.

BACKGROUND

The use of metal-based conductor mesh for application where light transmission and electrical conductance are needed is known in the art. Examples of such applications include shielding for electromagnetic interference for displays. In the industry, a mesh is typically understood to mean a pattern geometry having connected traces that are separated by open area to form cells.

It has been observed in the current work that some mesh designs, when integrated into a display and viewed under reflected, collimated light (such as in direct sunlight), may produce undesirable visual effects. Illustrative undesirable visual effects include, e.g., a starburst pattern for reflected light and bands of colored reflected light (similar to a rainbow) caused by light interference, each being observable when a mesh containing linear traces and a repeating cell geometry is disposed an unmodified substrate, such as a plastic film or glass. Illustrative examples of meshes with linear traces include those having hexagonal and square cells. Sparkle, which is an undesirable visual appearance of points of reflected light, can also appear for linear traced-based conductor meshes.

Some skilled in the art have attempted to use ambient light reducing members such as an optical interference member. See PCT International Publication No. WO 2003/105248 disclosing an optical interference member including a semi-absorbing member layer for reflecting a portion of incident ambient light, a substantially transparent layer for phase shifting another portion of ambient light and a reflective layer for reflecting the phase shifted ambient light such that the two reflected portions of light are out-of-phase and thereby destructively interfere.

Others have attempted to use a substrate having a nano-structured surface for disposing a conductor micropattern. See U.S. Patent Publication No. 2013/0299214 disclosing an article having (a) a substrate having a first nanostructured surface that is antireflective when exposed to air and an opposing second surface; and (b) a conductor micropattern disposed on the first surface of the substrate.

SUMMARY

There is a desire to improve the visual appearance of the metal-based conductor meshes, in terms of reducing their visibility, when the mesh is integrated into, for example, a display and viewed under reflected, collimated light, such as in direct sunlight.

Briefly, in one aspect, the present disclosure describes a method of forming an electrically conductive pattern on a substrate. A region of a major surface of the substrate can be selectively roughened to form at least one roughened pattern on the major surface of the substrate. One or more electrically conductive traces can be formed directly on the roughened region of the major surface of the substrate. The electrically conductive traces have one or more surfaces that are conformal with the roughened pattern on the major surface of the substrate.

In another aspect, a method of forming an electrically conductive pattern on a substrate with reduced visibility, is provided. A resist layer is provided on a major surface of the substrate. The resist layer includes a resist pattern including a land region having a reduced thickness. The resist layer is etched to remove the land region to form a lift-off mask and selectively expose a region of the major surface of the substrate underlying the land region. The etching is continued to roughen the exposed region of the major surface of the substrate to form at least one roughened pattern on the major surface of the substrate. A metal layer is disposed on the resist layer to form a plurality of electrically conductive traces directly on the roughened region of the major surface of the substrate. The plurality of electrically conductive traces is positioned to form the electrically conductive pattern corresponding to the roughened pattern on the major surface of the substrate. The lift-off mask along with a portion of the metal layer thereon is removed from the substrate to reveal the electrically conductive pattern on the substrate.

In another aspect, a method of forming a pattern on a substrate is provided. A resist layer is provided on a major surface of the substrate. The resist layer includes a resist pattern including a land region having a reduced thickness. The resist layer is etched to remove the land region to form a lift-off mask and selectively expose a region of the major surface of the substrate underlying the land region. The etching is continued to roughen the exposed region of the major surface of the substrate to form at least one roughened pattern on the major surface of the substrate. The lift-off mask is removed from the substrate to reveal the at least one roughened pattern.

In another aspect, an article includes a flexible substrate having a major surface capable of being roughened by reactive ion etching. The major surface includes a selectively roughened region and a non-roughened region to form at least one roughened pattern. One or more electrically conductive traces are disposed on the selectively roughened region of the major surface of the flexible substrate. The electrically conductive traces are in direct contact and conformal with the selectively roughened region of the major surface of the flexible substrate.

In another aspect, an article includes a flexible polymeric substrate having a major surface capable of being roughened by reactive ion etching. The major surface includes a selectively roughened region and a non-roughened region. The selectively roughened region forms at least one roughened pattern including one or more roughened traces. The roughened traces have a characteristics width of 0.2 to 5 micrometers, and a surface roughness of 0.1 to 1 micrometers.

In another aspect, a touch screen sensor includes first and second substrates that are connected by an optically clear adhesive disposed therebetween. At least one of the first and second substrates includes an article that a flexible substrate having a major surface capable of being roughened by reactive ion etching. The major surface includes a selectively roughened region and a non-roughened region to form at least one roughened pattern. One or more electrically conductive traces are disposed on the selectively roughened region of the major surface of the flexible substrate. The electrically conductive traces are in direct contact and conformal with the selectively roughened region of the major surface of the flexible substrate.

In another aspect, a touch screen sensor includes first and second substrates that are connected by an optically clear adhesive disposed therebetween. At least one of the first and second substrates includes an article includes a flexible polymeric substrate having a major surface capable of being roughened by reactive ion etching. The major surface includes a selectively roughened region and a non-roughened region. The selectively roughened region forms at least one roughened pattern including one or more roughened traces. The roughened traces have a characteristics width of 0.2 to 5 micrometers, and a surface roughness of 0.1 to 1 micrometers.

Various unexpected results and advantages are obtained in exemplary embodiments of the disclosure. One such advantage of exemplary embodiments of the present disclosure is that a major surface of a substrate is selectively roughened for metallization. That is, only the region of the major surface underlying an electrically conductive pattern is roughened. This allows other region of the substrate surface to be protected from etching or contamination during the formation of the electrically conductive pattern.

LISTING OF EXEMPLARY EMBODIMENTS

Exemplary embodiments are listed below. It is to be understood that any of embodiments 1-15, 16-19, 20-22, 23-35 and 36 can be combined.

Embodiment 1

A method of forming an electrically conductive pattern on a substrate, comprising:
selectively roughening a region of a major surface of the substrate to form at least one roughened pattern on the major surface of the substrate; and
forming one or more electrically conductive traces directly on the roughened region of the major surface of the substrate,
wherein the electrically conductive traces have one or more surfaces that are conformal with the roughened pattern on the major surface of the substrate.

Embodiment 2

The method of embodiment 1, wherein the electrically conductive traces only contact the substrate on the roughened region, and the electrically conductive traces form the electrically conductive pattern in correspondence with the roughened pattern on the major surface of the substrate.

Embodiment 3

The method of embodiment 1 or 2, further comprising forming a resist pattern on a resist layer on the major surface of the substrate, optionally wherein forming the resist pattern is achieved with a microreplication process that comprises forming a land region on the resist layer with reduced thickness, the resist layer being cured by radiation.

Embodiment 4

The method of embodiment 1 or 2, further comprising forming a resist pattern on a resist layer on the major surface of the substrate, optionally wherein forming the resist pattern is achieved with an embossing process that comprises coating the resist layer on the major surface of the substrate, and urging an embossing tool having a protruded feature into the resist layer to create a land region, the land region having a reduced thickness and corresponding to the protruding feature of the embossing tool.

Embodiment 5

The method of embodiment 3 or 4, further comprising reactive-ion etching the resist layer to remove the land region, form a lift-off mask, and selectively expose the region of the major surface of the substrate underlying the land region.

Embodiment 6

The method of embodiment 5, wherein selectively roughening the region of the major surface of the substrate comprises continuing the etching to roughen the exposed region of the major surface of the substrate.

Embodiment 7

The method of embodiment 6, wherein forming the electrically conductive traces comprises depositing at least one metal layer on the resist layer and the roughened region, and removing the lift-off mask along with a portion of the metal layer thereon from the substrate to reveal the electrically conductive pattern on the substrate.

Embodiment 8

The method of any one of embodiments 4-7, further comprising heating the resist layer when urging the embossing tool into the resist layer.

Embodiment 9

The method of any one of embodiments 4-8, wherein the resist layer comprises a thermally embossable polymer layer.

Embodiment 10

The method of any one of embodiments 3-9, wherein removing the resist layer comprises pressure-washing the resist layer.

Embodiment 11

The method of any one of embodiments 3-10, wherein the resist layer comprises a water soluble polymer layer.

Embodiment 12

The method of any preceding embodiment, wherein the substrate is a flexible, film-based substrate that comprises a polymeric material.

Embodiment 13

The method of embodiment 12, wherein the substrate comprises poly(ethylene terephthalate) (PET), poly(butylenes terephthalate) (PBT), poly(ethylerne naphthalate) (PEN), or a combination thereof.

Embodiment 14

The method of any preceding embodiment, wherein at least one of the electrically conductive traces comprises a metal layer and a blackening layer, and the blackening layer is disposed between the roughened region of the major surface of the substrate and the metal layer.

Embodiment 15

The method of any preceding embodiment, wherein at least one of the electrically conductive traces comprises a metal layer and a blackening layer, the metal layer is disposed between the roughened region of the major surface of the substrate and the blackening layer.

Embodiment 16

A method of forming an electrically conductive pattern on a substrate with a reduced visibility, comprising:
providing a resist layer on a major surface of the substrate, the resist layer comprising a resist pattern including a land region, the land region having a reduced thickness;
etching the resist layer to remove the land region to form a lift-off mask and selectively expose a region of the major surface of the substrate underlying the land region;
continuing the etching to roughen the exposed region of the major surface of the substrate to form at least one roughened pattern on the major surface of the substrate;
depositing a metal layer on the resist layer to form a plurality of electrically conductive traces directly on the roughened region of the major surface of the substrate, the plurality of electrically conductive traces being positioned to form the electrically conductive pattern corresponding to the roughened pattern on the major surface of the substrate; and
removing the lift-off mask along with a portion of the metal layer thereon from the substrate to reveal the electrically conductive pattern on the substrate.

Embodiment 17

The method of embodiment 16, wherein at least one of the electrically conductive traces has a bottom surface in direct contact with the roughened region of the major surface of the substrate, and a surface morphology of the bottom surface is conformal with the roughened region, such that the bottom surface of the electrically conductive traces is capable of scattering incident visible light to reduce a visibility of the electrically conductive pattern.

Embodiment 18

The method of embodiment 16, wherein providing the resist layer comprises coating a resist layer on the major surface of the substrate, and thermally embossing, via an embossing tool having a protruding feature, into the resist layer to create the resist pattern, the land region corresponding to the protruding feature of the embossing tool.

Embodiment 19

The method of embodiment 16, wherein providing the resist layer comprises creating, via a microreplication process, the resist pattern on the resist layer where the resist layer is cured by radiation.

Embodiment 20

A method of forming a pattern on a substrate, comprising:
providing a resist layer on a major surface of the substrate, the resist layer comprising a resist pattern including a land region, the land region having a reduced thickness;
etching the resist layer to remove the land region to form a lift-off mask and selectively expose a region of the major surface of the substrate underlying the land region;
continuing the etching to roughen the exposed region of the major surface of the substrate to form at least one roughened pattern on the major surface of the substrate; and
removing the lift-off mask from the substrate to reveal the at least one roughened pattern.

Embodiment 21

The method of embodiment 20, wherein providing the resist layer comprises coating a resist layer on the major surface of the substrate, and thermally embossing, via an embossing tool having a protruding feature, into the resist layer to create the resist pattern, the land region corresponding to the protruding feature of the embossing tool.

Embodiment 22

The method of embodiment 20, wherein providing the resist layer comprises creating a resist pattern on the resist layer, optionally by a microreplication process where the resist layer is cured by radiation.

Embodiment 23

An article, comprising:
a flexible substrate having a major surface capable of being roughened by reactive ion etching, the major surface comprising a selectively roughened region and a non-roughened region to form at least one roughened pattern; and one or more electrically conductive traces disposed on the selectively roughened region of the major surface of the flexible substrate, the electrically conductive traces being in direct contact and conformal with the selectively roughened region of the major surface of the flexible substrate.

Embodiment 24

The article of embodiment 23, wherein the electrically conductive traces only contact the substrate on the selectively roughened region of the major surface of the substrate, and the electrically conductive traces are positioned to form an electrically conductive pattern in correspondence with the roughened pattern on the major surface of the substrate.

Embodiment 25

The article of embodiment 23 or 24, wherein the flexible substrate comprises a transparent polymeric film.

Embodiment 26

The article of embodiment 25, wherein the polymeric film comprises poly(ethylene terephthalate) (PET), poly(butylenes terephthalate) (PBT), poly(ethylerne naphthalate) (PEN), or a combination thereof.

Embodiment 27

The article of any one of embodiments 23-26, wherein the electrically conductive traces have a characteristic width of 0.2 to 5 micrometers, and optionally have a characteristic thickness of 25 to 500 nm.

Embodiment 28

The article of any one of embodiments 23-27, wherein at least one of the electrically conductive traces has a bottom surface in direct contact with the selectively roughened region of the major surface of the substrate, and an upper surface opposite the bottom surface, and the bottom surface has a surface morphology conformal with the selectively roughened region of the major surface of the substrate, wherein the at least one of the electrically conductive traces only contacts the substrate on the selectively roughened region, and further wherein the electrically conductive traces form an electrically conductive pattern in correspondence with the selectively roughened region of the major surface of the substrate.

Embodiment 29

The article of embodiment 28, wherein the bottom surface of the at least one electrically conductive trace has a surface roughness of 0.1 to 1 micrometers.

Embodiment 30

The article of embodiment 28 or 29, wherein the upper surface has a surface morphology following the surface morphology of the respective bottom surface.

Embodiment 31

The article of any one of embodiments 28-30, wherein the upper surface of the at least one electrically conductive trace has a surface roughness of 0.1 to 1 micrometers.

Embodiment 32

The article of any one of embodiments 23-31, wherein at least one of the electrically conductive traces comprises a metal layer and a blackening layer.

Embodiment 33

The article of any of embodiments 23-32, wherein the blackening layer is disposed between the roughened region of the major surface and the metal layer.

Embodiment 34

The article of any of embodiments 23-32, wherein the metal layer is disposed between the roughened region of the major surface and the blackening layer.

Embodiment 35

The article of any of embodiments 23-34, wherein the metal layer includes at least one of copper, silver, aluminum, gold, and combinations thereof.

Embodiment 36

An article, comprising:
a flexible polymeric substrate having a major surface capable of being roughened by reactive ion etching,
the major surface comprising a selectively roughened region and a non-roughened region, the selectively roughened region forming at least one roughened pattern including one or more roughened traces, and
the roughened traces having a characteristics width of 0.2 to 5 micrometers, and a surface roughness of 0.1 to 1 micrometers.

Embodiment 37

A touch screen sensor comprising:
first and second substrates each comprising the article of any one of embodiments 23-36, wherein the first and second substrates are connected by an optically clear adhesive disposed therebetween.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

The present disclosure provides methods of forming an electrically conductive pattern on a substrate with reduced visibility. A region of a major surface of the substrate can be selectively roughened to form at least one roughened pattern on the major surface of the substrate. One or more electrically conductive traces can be formed directly on the roughened region of the major surface of the substrate. The electrically conductive traces can have one or more surfaces that are conformal with the roughened pattern on the major surface of the substrate. This allows the electrically conductive traces to reflect incident light diffusely, thereby reducing the visibility of the electrically conductive pattern on the substrate.

Figure 1:
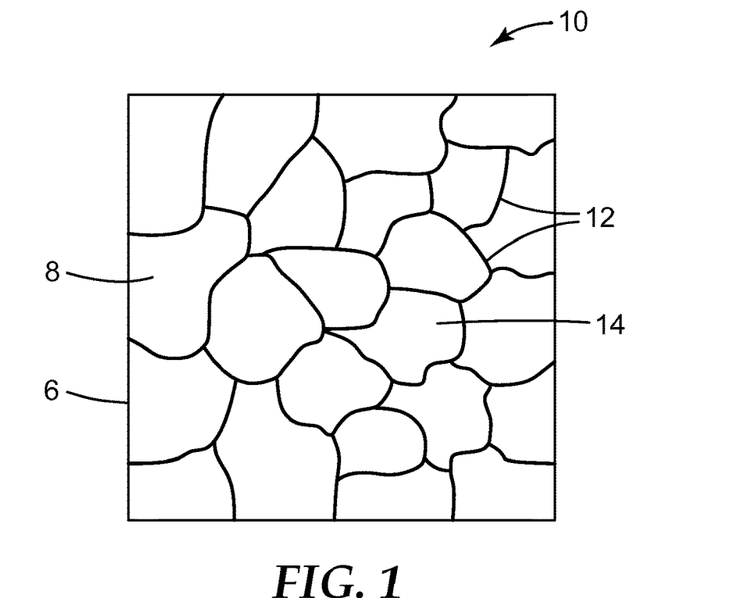
FIG. 1 is a top plan view of a schematic of an electrically conductive pattern on a substrate, according to one embodiment.

FIG. 1 shows a top plan view of an illustrative geometry of an electrically conductive pattern 10 disposed on a major surface 8 of a substrate 6, according to one embodiment. The electrically conductive pattern 10 includes a plurality of electrically conductive traces 12 defining a plurality of open area cells 14. The electrically conductive traces 12 are formed directly on a selectively roughened region of the major surface 8 of the substrate 6. In the embodiment of FIG. 1, the electrically conductive traces 12 only contact the substrate 6 on the selectively roughened region (not visible in FIG. 1 as it is completely covered the electrically conductive traces 12). That is, the electrically conductive pattern 10 formed by the electrically conductive traces 12 corresponds to a roughened pattern formed by the selectively roughened region on the major surface 8 of the substrate 6. It will be appreciated that, in some embodiments, the electrically conductive traces 12 may partially cover the selectively roughened regions at the major surface 8 of the substrate 6. It will be also appreciated that, in other embodiments, the electrically conductive traces 12 may contact the substrate 6 at a non-roughened region of the major surface 8.

The geometry of FIG. 1 includes cells 14 defined by curved conductive traces 12. It is to be understood that the electrically conductive pattern 10 can have any suitable geometries. In some embodiments, the electrically conductive pattern 10 can include, for example, dots, traces, filled shapes, or combinations thereof. The electrically conductive traces 12 can be linear or non-linear.

The electrically conductive traces 12 can be conformal with the roughened pattern on the major surface 8 of the substrate 6 and provide roughened surface(s) to reflect incident light diffusively. The reflectance of the electrically conductive pattern 10 can be diminished by disposition on the selectively roughened region at the major surface 8 of the substrate 6, as compared with the reflectance for an identically fabricated pattern on a flat, reflective substrate surface (for example, a surface of typical poly(ethylene terephthalate) or PET film). The embodiments described in this disclosure can reduce the visibility of the electrically conductive pattern 10. In some embodiments, the incidence of certain potentially undesirable visual features from the electrically conductive pattern 10 can be substantially diminished. The diminution can be especially notable for viewing, imaging, or measurement of the electrically conductive pattern 10 from the direction facing the major surface 8 of the substrate 6.

In some embodiments, the reflectance of the electrically conductive traces 12 is less than 90%, less than 50%, less than 20%, less than 10%, less than 5%, or less than 1%, measured at normal incidence and in a direction oriented toward the major surface 8 of the substrate 6 onto which the electrically conductive traces 12 are disposed. As a comparison, the specular reflectance of smooth thin film metals such as silver or aluminum may exceed 90% in the visible spectrum. Specific means for reducing the reflectance of an electrically conductive pattern are the subject of the present disclosure. The means solve the problem of high reflectance for metallic deposits on substrates when the metallic deposit is of relatively high optical density (i.e., metallic deposit that is not transparent, for example that transmits less than 5% visible light or even less than 1% visible light), and thus render the otherwise reflective, non-transparent metallic coatings, deposits, or micropatterns with reduced visibility.

The electrically conductive traces 12 can have a thickness of, for example, 25 to 500 nm, and a width of, for example, 0.5 to 10 micrometers. In some embodiments, the electrically conductive traces 12 can have a thickness of 100 nm to 1 micrometer, and a width of, 1 to 10 micrometers. The electrically conductive traces 12 can include one or more metals, for example, at least one of gold, silver, palladium, platinum, aluminum, copper, molybdenum, nickel, tin, tungsten, alloys, and combinations thereof. In some embodiments, the electrically conductive traces 12 can include at least one of copper, silver, and aluminum. It is to be understood that the electrically conductive traces 12 can include any suitable electrically conductive material. In one embodiment, the electrically conductive traces 12 can include a composite material, for example, a metal-filled polymer.

The substrate 6 can include polymeric materials. In some embodiments, the substrate 6 can be a polymeric film that is in the form of a flat sheet and is sufficiently flexible and strong to be processed in a roll-to-roll fashion. Polymeric films used as substrates in articles described herein are sometimes referred to as base films. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from, for example, 5 micrometers to 1000 micrometers. In some embodiments, polymeric film thicknesses range from 25 micrometers to 500 micrometers, or from 50 micrometers to 250 micrometers, or from 75 micrometers to 200 micrometers. Roll-to-roll polymeric films may have a width of at least 12 inches, 24 inches, 36 inches, or 48 inches. Polymeric films can include, for example, poly(ethylene terephthalate) (PET), poly(butylenes terephthalate) (PBT), poly(ethylene naphthalate) (PEN), polycarbonate, cellulose triacetate, etc. In some embodiments, the substrate 6 can include PET, PBT, PEN, or a combination thereof.

In some embodiments, the electrically conductive pattern 10 can be formed by selectively roughening a region of the major surface 8 of the substrate 6 to form at least one roughened pattern thereon, and forming the electrically conductive traces 12 directly on the roughened region of the major surface 8 of the substrate 6. The selectively roughening of the major surface 8 can be performed by any appropriate technique including, for example, etching. The electrically conductive traces 12 can be deposited, by any appropriate deposition or coating technique, on the selectively roughened region of the substrate 6 as long as the deposited traces have one or more roughened surfaces capable of reflect incident light diffusely.

Figure 2A:
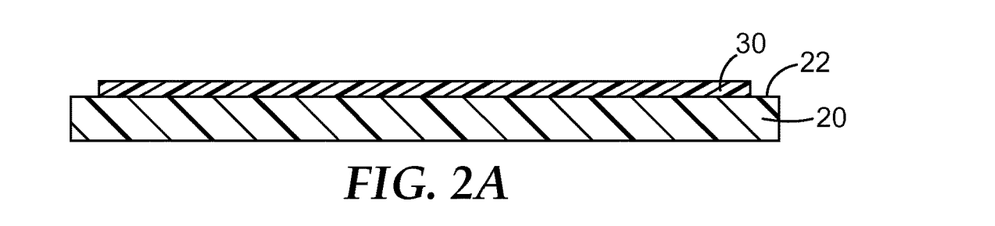
FIG. 2A is a cross sectional view of a substrate having a resist layer carried thereon, according to one embodiment.

FIGS. 2A-2M illustrates processes for forming an electrically conductive pattern on a substrate such as, for example, for forming the electrically conductive pattern 10 on the substrate 6 as shown in FIG. 1. FIG. 2A shows a substrate 20 having a resist layer 30 disposed on a major surface 22 of the substrate 20. The substrate 20 can be, for example, the substrate 6 shown in FIG. 1. In some embodiments, the resist layer 30 can be an embossable polymer layer that can be coated on the substrate 20 and followed by drying. The resist layer 30 can include, for example, polyvinyl alcohol (PVA). In some embodiments, the resist layer 30 can include a resin composition that is curable by radiation (e.g., ultraviolet light).

In some embodiments, the resist layer 30 is a water-soluble polymer that can be removed from the substrate 20 by pressure washing. It is to be understood that the resist layer 30 can be any appropriate resist layer that can serve as a lift-off mask during a process for selectively roughening the substrate 20. In some embodiments, the resist layer 30 can be strippable from the substrate by applying a solvent other than water. For example, the resist layer 30 can include poly(methyl methacrylate) (PMMA) that can be removed from the substrate 20 by an organic solvent. It is to be understood that the resist layer 30 can be any appropriate resist layer that can be removed from the substrate 20 by applying, for example, a solvent. The resist layer 30 has a thickness of, for example, 0.25 to 10 micrometers, or 0.5 to 5 micrometers. The resist layer 30 can be formed through any appropriate process such as, for example, roll coating, dip coating, spaying, spin coating, slot die coating, slide coating, curtain coating, solvent coating, etc.

Figure 2B:
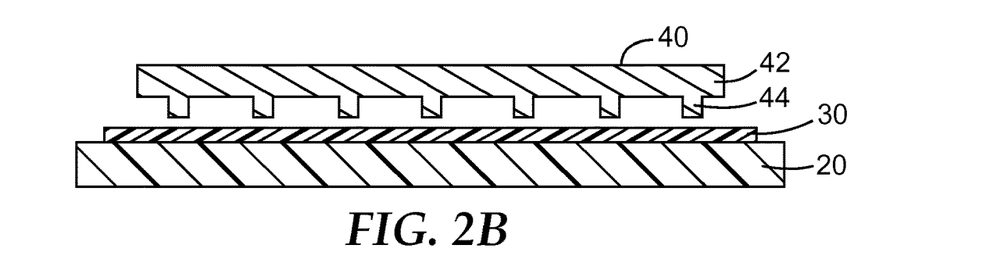
FIG. 2B is a cross sectional view of an embossing tool and the substrate of FIG. 2A.

FIG. 2B shows an embossing tool 40 having a body 42 and a plurality of protruded features 44. In some embodiments, the protruded features 44 have a depth of, for example, 1 to 10 micrometers, or 2 to 5 micrometers and a lateral width of, for example, 0.1 to 10 micrometers, or 0.2 to 5 micrometers. In some embodiments, the protruded features 44 have a depth of, for example, 2 to 5 micrometers and a lateral width of, for example, 0.2 to 5 micrometers. The embossing tool 40 can be made of metals, dielectrics, polymers, semiconductors, ceramics, or the combinations thereof. In one embodiment, the embossing tool 40 is made of nickel.

Figure 2C:
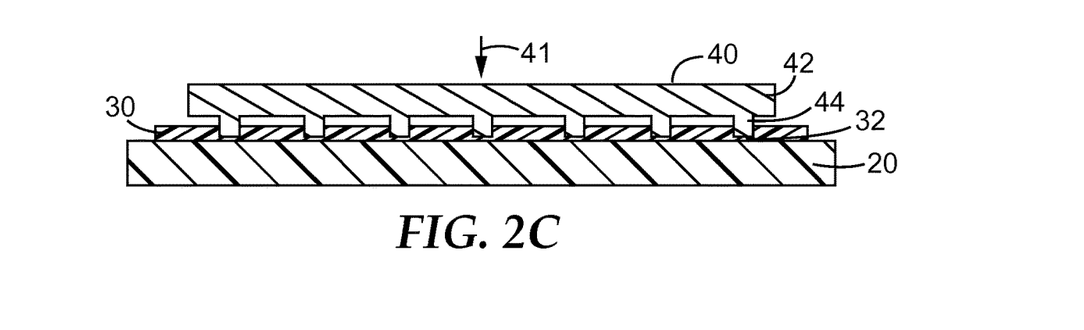
FIG. 2C is a cross sectional view of the embossing tool and the substrate of FIG. 2B showing the embossing tool pressed into the resist layer on the substrate.

FIG. 2C shows an embossing step where the embossing tool 40 is pressed or urged into the resist layer 30 in a direction shown by an arrow 41 forming compressed regions or land regions 32 at the resist layer 30. In some embodiments, the embossing process can be a thermal embossing process where the resist layer 30 can be heated at a temperature to allow sufficient softening of the material thereof relative to the embossing tool 40. For example, the resist layer 30 can heated to be above the glass transition temperature of a polymeric material thereof, e.g., PVA.

In the embodiment shown in FIG. 2C, the protruded features 44 are partially pressed into the resist layer 30. In other embodiments, the protruded features 44 can be pressed all of the way into the resist layer 30. In some embodiments, a release layer can be bonded to the surface of the protruded features 44. The release layer can include nano- or micro-scale relief features to improve the release of the resist layer 30 from the protruded features 44 of the embossing tool 40.

Figure 2D:
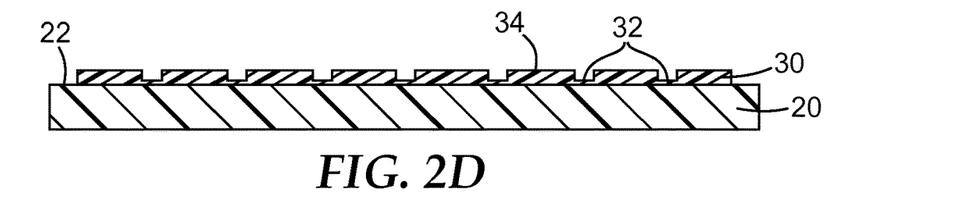
FIG. 2D is a cross sectional view of the substrate of FIG. 2C following compression of the embossing tool into the resist layer.

FIG. 2D is a cross sectional view showing the resist layer 30 carried by the substrate 20 following the removal of the embossing tool 40. The resist layer 30 includes a plurality of recesses formed at the land regions 32 which are generally conformal with the shape of the protruded features 44 of the embossing tool 42. The land regions 32 have a reduced thickness compared to uncompressed regions 34 of the resist layer 30. In some embodiments, the land regions 32 have a thickness of, for example, 150 nm to 1 micrometer. The ratio between the thickness of the uncompressed regions 34 and the land regions 32 can be, for example, 2:1 to 12:1.

Alternatively, in some embodiments, the resist layer 30 including the land regions 32 with reduced thickness can be prepared by a microreplication process. In one exemplary microreplication process, a suitable resin composition can be applied on the major surface 22 of the substrate 20. A tool having protruded features such as, for example, the embossing tool 40 having the protruded features 44, can be used to pressed into the resin composition which can be cured by a radiation source to form a resist pattern having the land regions 32. The thickness ratio between the uncompressed regions 34 and the land regions 32 can be, for example, 5:1 to 20:1. In some embodiments, a higher thickness ratio between the uncompressed regions 34 and the land regions 32 can be obtained by the microreplication process as compared to the embossing process described above.

The radiation source can include, for example, ultraviolet (UV) light, visible light, etc. In some embodiments, the substrate 20 can be substantially transparent to UV light and the UV light can irradiate the resin composition through the substrate 20 to cure the resin composition. An exemplary microreplication process is illustrated in FIG. 4 of U.S. Pat. No. 5,691,846 (Benson, Jr. et al).

Figure 2E:
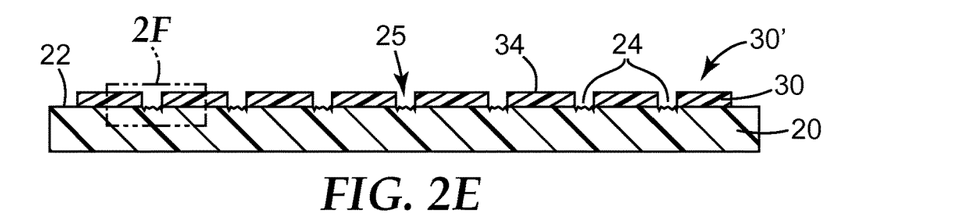
FIG. 2E is a cross sectional view of the substrate of FIG. 2D showing selectively roughened patterns on the substrate.

FIG. 2E illustrates a cross sectional view of the substrate 20 of FIG. 2D that is processed to form selectively roughened patterns into the major surface 22 of the substrate 20. The land regions 32 are removed from the substrate 20, thereby exposing regions 24 at the major surface 22 of the substrate 20 underlying the land regions 32. Following the removal of the land regions 32, the resist layer 30 forms a lift-off mask 30' with a masked pattern that selectively exposes the regions 24 of the substrate 20 and covers/protects other regions of the substrate 20. The land regions 32 can be removed by reactive ion etching (RIE) including, for example, oxygen plasma etching. It is to be understood that the removal of the land regions 32 can be achieved through any appropriate process including, for example, dry etching, or wet chemical etching.

The RIE process, for example, involves generating plasma under vacuum by an electromagnetic field. High energy ions from the plasma can attack or etch away the land regions 32 of the resist layer 30. A typical RIE system can be used. The power density of RF power of the RIE process can be in the range of about 0.1 to about 1.0 watts/cm$^2$ (preferably, about 0.2 to about 0.3 watts/cm$^2$). In some embodiments, the RIE process can be carried out using a continuous roll-to-roll process. For example, the method of the present disclosure can be carried out using "cylindrical" RIE that utilizes a rotating cylindrical electrode.

Following the removal of the land regions 32, the reactive ion etching (RIE) is continued to etch into the exposed regions 24 of the major surface 22, and thereby roughening the exposed regions 24 to form a roughened pattern 25 on the major surface 22 of the substrate 20. The regions of major surface 22 outside of the exposed regions 24 are covered and protected by the un-removed portion 34 of the resist layer 30. The roughened regions 24 can have a lateral width corresponding to the lateral width of the protruding features 44 of the embossing tool 40, for example, 0.1 to 10 micrometers, or 0.2 to 5 micrometers. In some embodiments, the RIE can etch into the substrate 20 to form various patterns, for example, a trench, where a bottom surface and side walls of the trench can be roughened by the RIE. In some embodiments, the RIE may selectively roughen the surface of the substrate without etching into the bulk region of the substrate 20.

Figure 2F:
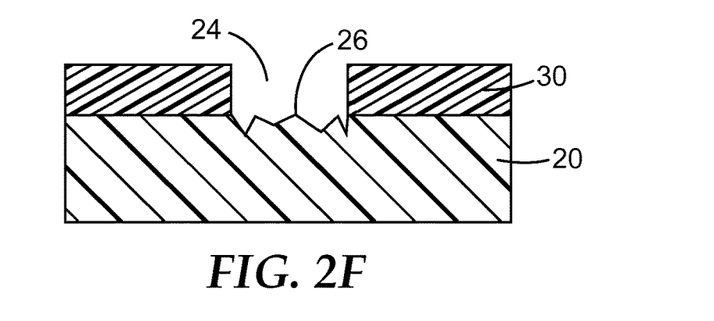
FIG. 2F is a partial enlarged view of FIG. 2E.
Figure 2G:
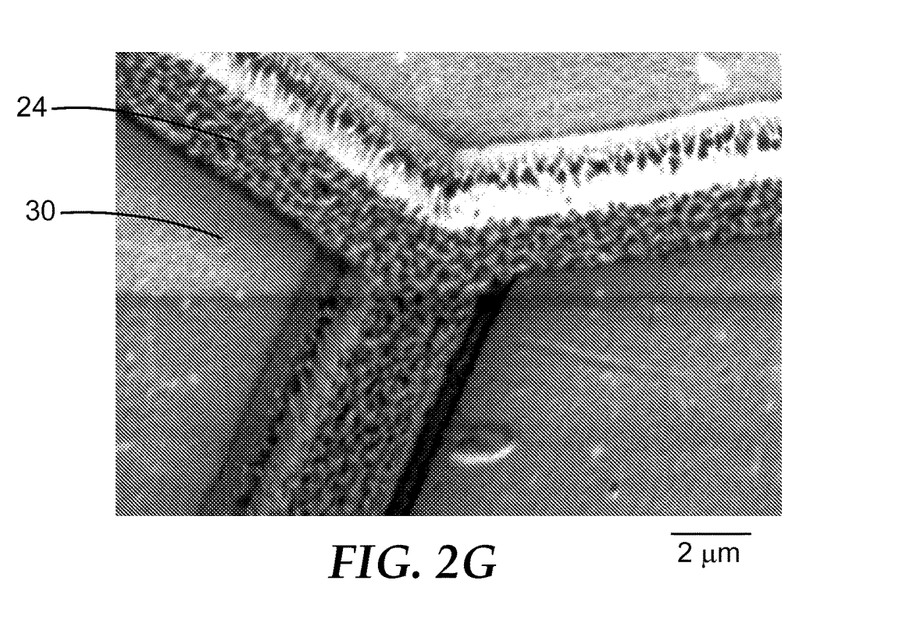
FIG. 2G is a perspective view scanning electron microscope (SEM) image of a portion of the substrate of FIG. 2E showing selectively roughened patterns on the substrate.

FIG. 2F shows an enlarged portion of FIG. 2E. FIG. 2G is a perspective view scanning electron microscope (SEM) image of a portion of FIG. 2E. The exposed regions 24 are roughened, via the reactive ion etching (RIE), to form a plurality of micro-scale or nano-scale features 26. The roughened regions 24 can include the features 26 having a height from 10 nm to 2 micrometers, a width from 15 to 200 nm, and a lateral spacing from 10 nm to 2 micrometers, or 100 nm to 1 mm. The roughened regions 24 can have an average surface roughness of, for example, 0.05 to 2 micrometers, 0.1 to 1 micrometer, or 0.2 to 1 micrometer.

The RIE treated regions 24 at the major surface 22 can be a micro- or nano-structured surface where the features 26 can protrude outside the major surface 22 of the substrate 20. The roughened regions 24 can be anisotropic (height of protrusive features is greater than lateral dimension of protrusive features) and random (positions of protrusive features are not defined, for example periodic). In the embodiment shown in FIG. 2D-E, an oxygen plasma etching is applied to remove the land regions 32 and roughen the exposed regions 24 at the major surface 22 of the substrate 20. It is to be understood that in some embodiments, plasma etching using plasma gases including, for example, Ar, $H_2$, $N_2$, or $NH_3$ can be applied. Optionally, the substrate can be roughened by the deposition of discontinuous mask, or by the addition of depositing precursors on the major surface along with the etching gas mixtures, as described in U.S. Pat. No. 8,634,146 (David et al).

Figure 2H:
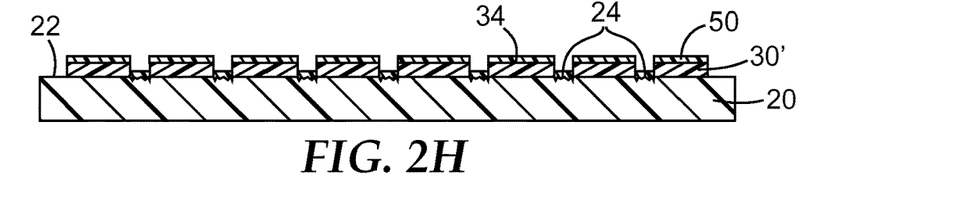
FIG. 2H is a cross sectional view of the substrate of FIG. 2E showing metal deposition on a lift-off mask, according to one embodiment.

Following the roughening of the exposed regions 24, an electrically conductive material can be disposed on the lift-off mask 30' at the major surface 22 of the substrate 20. In the embodiment as shown in FIG. 2H, a layer of metal 50 is deposited over the substrate 20. The layer of metal 50 is deposited onto the un-removed portion 34 of the resist layer 30 and onto the selectively roughened regions 24 of the substrate 20. The layer of metal 50 can be formed by any desired process including, for example, evaporating, sputtering, e-beam deposition, physical vapor deposition, chemical vapor deposition, etc. In some embodiments, the metal layer 50 can be formed via a solution process, for example, by coating a metal nanoparticulate ink. In some embodiments, the metal layer 50 can have an average thickness of, for example, 0.01 to 2 micrometers, 0.02 to 1 micrometer, or 0.025 to 0.5 micrometers. In some embodiments, the metal layer 50 can be continuous, have one or more surfaces conformal with the surface morphology of the roughened regions 24, and have a generally uniform thickness. In some embodiments, the metal layer 50 may have a non-uniform thickness.

Figure 2I:
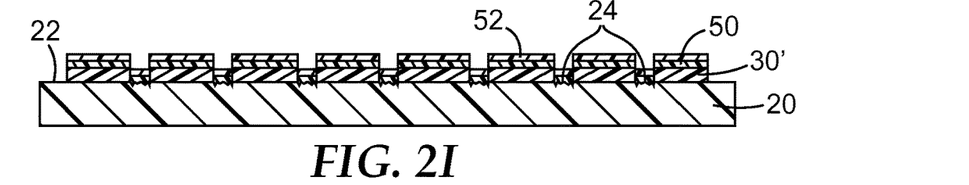
FIG. 2I is a cross sectional view of the substrate of FIG. 2E showing a blackening layer and a metal layer on the lift-off mask, according to another embodiment.

Optionally, in another embodiment as shown in FIG. 2I, a blackening layer 52 is deposited over the metal layer 50 to form a two-layer metallic stack. The blackening layer 52 can include, for example, titanium, chrome, or a combination thereof. The blackening layer 52 can appear black or tarnished to reduce the visibility of the metallic stack. Alternatively, in some embodiments, the blackening layer 52 can be disposed between the metal layer 50 and the roughened regions 24 of the substrate 20. The blackening layer 52 underlying the metal layer 50 may also act as a tie layer to promote adhesion between the metal layer 50 and the substrate 20. It is to be understood that more than one blackening layers can be provided along with the metal layer 50. For example, in some embodiments, the metal layer 50 can be sandwiched by two blackening layers.

After the metal layer 30 is formed on the lift-off mask 30' at the major surface 22 of the substrate 20, a lift-off process can be performed to remove the remaining portion 34 of the resist layer 30. In the embodiments shown in FIGS. 2A-2M, the resist layer 30 is a water-soluble polymer layer that can be removed from the substrate 20 by, for example, pressure washing. In some embodiments, the resist layer 30 can be strippable from the substrate by applying a solvent other than water. For example, the resist layer 30 can include poly(methyl methacrylate) (PMMA) that can be washed away from the substrate 20 with a suitable organic solvent. It is to be understood that the resist layer 30 can be any appropriate resist layer that can be removed from the substrate 20 by applying, for example, a solvent. The lift-off process can be any selective chemical etching process that can be applied to remove the resist layer 30 from the substrate 20.

Figure 2J:
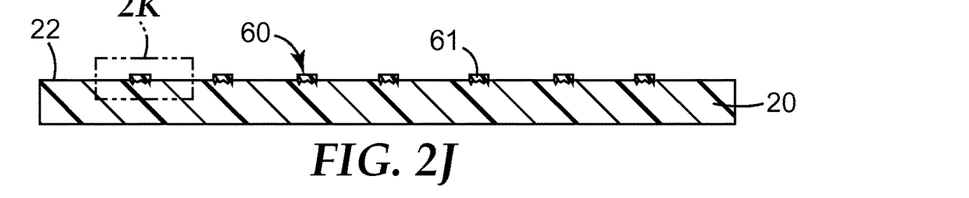
FIG. 2J is a cross sectional view of the substrate of FIG. 2H showing removal of the lift-off mask.
Figure 2K:
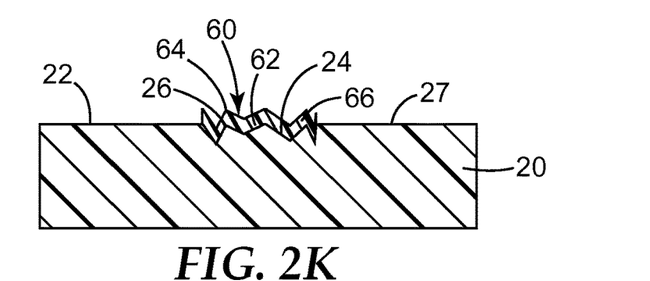
FIG. 2K is a partial enlarged view of FIG. 2J.
Figure 2L:
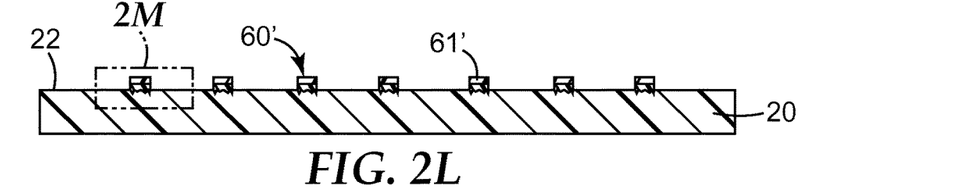
FIG. 2L is a cross sectional view of the substrate of FIG. 2I showing the metallic stack of blackening layer and metal layer.
Figure 2M:
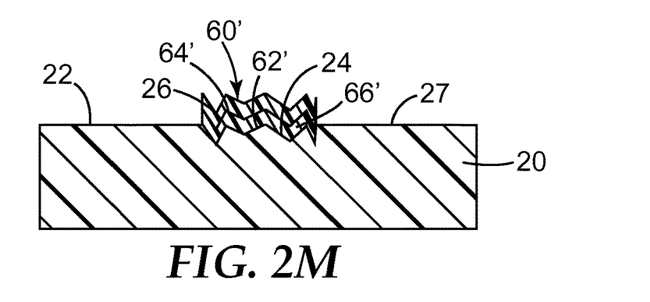
FIG. 2M is a partial enlarged view of FIG. 2L.

FIGS. 2J and 2L respectively show the structures of FIGS. 2H and 2I after the removal of the resist layer 30 along with the portion of metal(s) disposed thereon from the substrate 20. An electrically conductive pattern 61 or 61' is formed on the roughened regions 24 and left at the major surface 22 of the substrate 20. The electrical conductive pattern 61 or 61' includes a plurality of electrically conductive traces 60 or 60'. The electrically conductive traces can include, for example, the electrically conductive traces 12 of FIG. 1. FIGS. 2K and 2M respectively show an enlarged portion of FIGS. 2J and 2L.

The electrically conductive traces 60 have a bottom surface 62 and an upper surface 64 opposite to the bottom surface 62. The bottom surface 62 is in direct contact with the roughened regions 24 at the major surface 22 of the substrate 20. The bottom surface 62 has a surface morphology that is conformal with that of the roughened regions 24 at the major surface 22. The bottom surface 62 can scatter incident visible light to reduce a visibility of the electrically conductive traces 60. In some embodiments, the bottom surface 62 can include micro-scale or nano-scale features 66 that are negative replica of the micro-scale or nano-scale features 26 of the roughened regions 24. The upper surface 64 have a surface morphology that follows the surface morphology of the bottom surface 62. In some embodiments, the bottom surface 62 of the electrically conductive traces 60 has an average surface roughness of, for example, 0.1 to 1 micrometers. In some embodiments, the upper surface 64 has an average surface roughness of, for example, 0.1 to 1 micrometers. In some embodiments, the electrically conductive traces 60 can have side surfaces with an average surface roughness of, for example, 0.05 to 0.5 micrometers.

In the embodiment shown in FIG. 2K, the electrically conductive traces 60 only contact the substrate 20 on the selectively roughened regions 24. It is to be understood that in some embodiments, the electrically conductive traces 60 may cover the edge between the selectively roughened regions 24 and non-roughened regions 27 at the major surface 22 of the substrate 22. In some embodiments, the electrically conductive traces 60 may not cover the edge between the selectively roughened regions 24 and the non-roughened regions 27 at the major surface 22 of the substrate 22. In some embodiments, the electrically conductive traces 60 may cover only a portion of the selectively roughened regions 24.

As shown in FIG. 2M, the electrically conductive traces 60' include a two-layer metallic stack of a blackening layer deposited over a metal layer. Similar to the electrically conductive traces 60, the electrically conductive traces 60' have a bottom surface 62' and an upper surface 64' opposite to the bottom surface 62'. The bottom surface 62' is in direct contact with the roughened regions 24 at the major surface 22 of the substrate 20. The bottom surface 62' has a surface morphology that is conformal with that of the roughened region 24. The bottom surface 62' can scatter incident visible light to reduce a visibility of the electrically conductive traces 60. In some embodiments, the bottom surface 62' can include micro-scale or nano-scale features 66' that are negative replica of the micro-scale or nano-scale features 26 of the roughened regions 24. In some embodiments, the bottom surface 62' has an average surface roughness of 0.1 to 1 micrometers. The upper surface 64' is a surface of the blackening layer. In some embodiments, the upper surface 64' can have a surface morphology that follows the surface morphology of the bottom surface 62'. In other embodiments, the upper surface 64' may be flat with an average surface roughness of less than 0.1 micrometers. In some embodiments, the electrically conductive traces 60' can have side surfaces with an average surface roughness of 0.05 to 0.5 micrometers.

Figure 3:
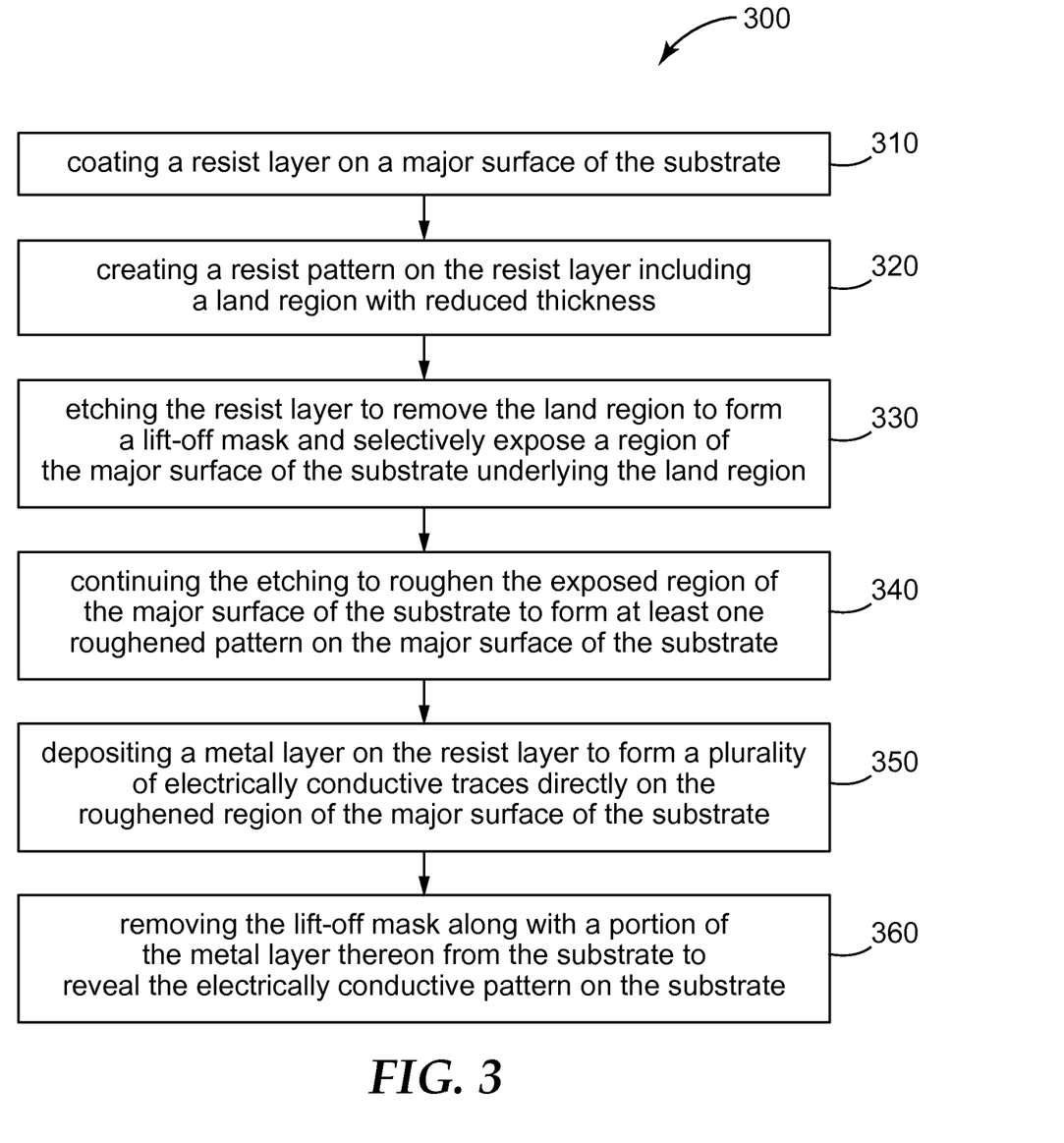
FIG. 3 is a flow diagram illustrating a method of forming an electrically conductive pattern on a substrate, according to one embodiment.
Figure 4A:
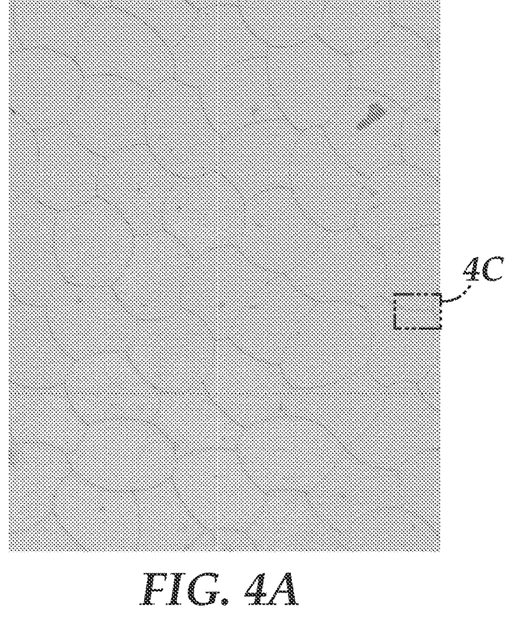
FIG. 4A is a plan view microscope image of Example 1 (25× magnification).
Figure 4B:
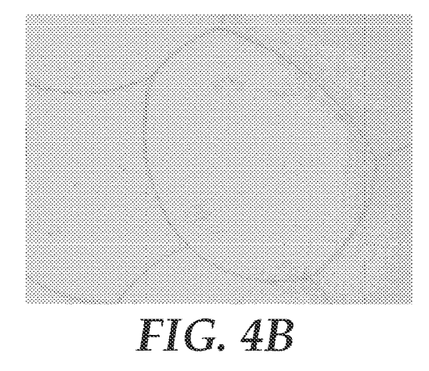
FIG. 4B is a partial enlarged view of FIG. 4A (100× magnification).
Figure 4C:
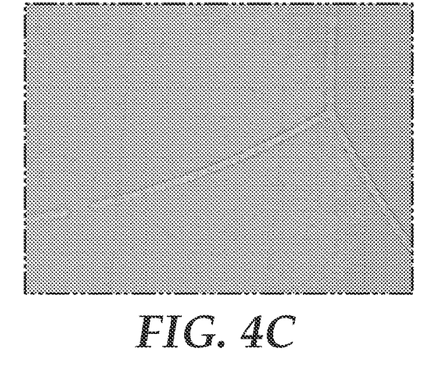
FIG. 4C is a partial enlarged view of FIG. 4A showing electrically conductive traces (500× magnification).

FIG. 3 is a flow diagram illustrating a method 300 of forming, for example, an electrically conductive pattern on the substrate 20 of FIGS. 2A-2M. At 310, the resist layer 30 is coated on the major surface 22 of the substrate 20. The method 300 then proceeds to 320.

At 320, a resist pattern is created on the resist layer 30. The resist pattern includes a land region with reduced thickness. In some embodiments, the resist pattern can be created via an embossing process. The embossing tool 40 having a protruding feature 44 can be pressed into the resist layer 30 to create an embossed pattern or a resist pattern on the resist layer 30. In some embodiments, the embossing process can be a thermal embossing process where the resist layer 30 can be heated at a temperature to allow sufficient softening of the material thereof relative to the embossing tool 40. The embossed pattern includes a land region 32 having a reduced thickness. The embossed pattern corresponds to the protruding feature 44 of the embossing tool 40. Alternatively, in other embodiments, the resist pattern can be created via a microreplication process where the resist layer 30 can include a resin composition that can be cured by radiation, e.g., UV light, to form a resist pattern. The method 300 then proceeds to 330.

At 330, the resist layer 30 is etched to remove the land region 32 to form a lift-off mask 30' and selectively expose a region 24 of the major surface 22 of the substrate 20 underlying the land region 32. The method 300 then proceeds to 340.

At 340, the etching is continued to roughen the exposed region 24 of the major surface of the substrate to form at least one roughened pattern 25 on the major surface 22 of the substrate 20. The method 300 then proceeds to 350.

At 350, the metal layer 50 is deposited on the resist layer 30 to form the plurality of electrically conductive traces 60 or 60' directly on the roughened region 24 of the major surface 22 of the substrate 20. The plurality of conductive traces 60 or 60' are positioned to form the electrically conductive pattern 61 or 61' corresponding to the roughened pattern 25 on the major surface 22 of the substrate 20. The method 300 then proceeds to 360.

At 360, the lift-off mask 30' along with a portion of the metal layer 50 thereon is removed from the substrate 20 to reveal the electrically conductive pattern 61 or 61' on the substrate. At least one of the electrically conductive traces 60 or 60' has a bottom surface 62 or 62' in direct contact with the roughened region 24 at the major surface 22 of the substrate 20, and a surface morphology of the bottom surface 62 or 62' is conformal with the roughened region 24, such that the bottom surface 62 or 62' of the electrically conductive traces 60 or 60' is capable of scattering incident visible light to reduce a visibility of the electrically conductive pattern 61 or 61'.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

Example 1—1.5-3.0 Micron-Scale Aluminum Mesh Patterned onto 5 mil PET

An example film with an aluminum metal micromesh patterned onto the surface of a PET substrate (about 5 mil thick), as shown in FIGS. 4A-C and 5, was made by the following processing steps:

(1) Coating:

A mixture of 5% by weight Poly(vinyl alcohol) (PVA, average molecular weight=9000-10000, 80% hydrolyzed, available from Sigma-Aldrich, St. Louis, Mo.) in 95% deionized (DI) water was mixed by heated agitation in a one-gallon clear bottle to yield a water soluble polymer coating formulation. The PVA in DI water coating formulation was coated 11 inches wide on a 5 mil polyethylene terephthalate (PET) substrate (Dupont Melinex ST-504) at a speed of 20 ft/min and fluid delivery rate of 35 g/min use a slot coating die, resulting in a wet film thickness between 15 and 25 micrometers. The coating was then passed into an air impingement dryer to dry the coating, removing the water such that the film was dry to the touch. The dried film has a thickness of approximately between 0.75 and 1.25 micrometers.

(2) Thermal Embossing:

The dried film was thermally embossed roll to roll at about 5 ft/min using a patterned nickel tool. The nickel tool was composed of predetermined patterned randomized mesh-structure, where the features of the mesh had a characteristic width of 2 to 3 micrometers and a depth of 2 to 5 micrometers. The embossing occurred with a tool roll temperature of 195° F., with the nip roll at 100° F. The nip pressure was set at 4000 lb. The top roll was a 68 durometer deformable rubber roll.

(3) Roll-To-Roll Reactive Ion Etching (R2R-RIE):

The embossed film was then reactive ion etched (RIE) in a roll-to-roll fashion in a plasma chamber. A general RIE process is described in U.S. Pat. No. 8,634,146 (David et al). The etching took place at 4 ft/min with a RF power of 6000 W, over a 20-inch diameter drum electrode comprising a 60-inch web path through the RIE zone, resulting a in a residence exposure time of 75 seconds. The gas composition in plasma chamber consisted of $O_2$ with a flow rate of 1000 std. $cm^3$/min and pressure of 8 mTorr. The reactive ion etching removed the embossed regions, or lands, giving access to the underlying PET substrate. In the etch process, the PET film was selectively roughened in the now-exposed regions. The now-patterned PVA layer forms a water-soluble lift-off mask on the PET substrate.

(4) Metal Deposition:

Following reactive ion etching of step (3), an aluminum metal layer between 25 and 150 nm was vacuum coated onto the lift-off mask created in step (3).

(5) Lifting Off:

Removal of the water-soluble PVA layer was achieved by using a pressure washing system. Using a 500 psig water wash source, the remaining PVA was undercut, lifting off the PVA and metal attached to it. The lift off step leaves behind the desired selectively-roughened metallic pattern on the PET.

Figure 5:
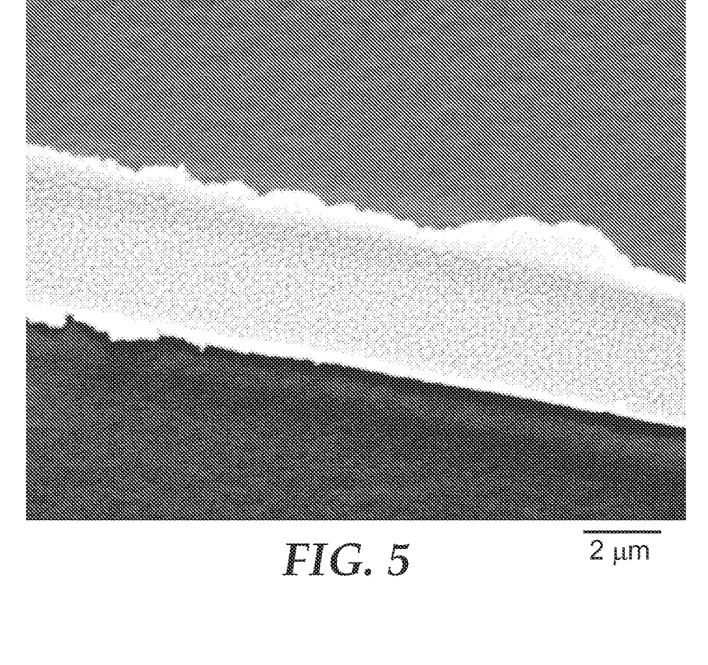
FIG. 5 is a plan view scanning electron microscope (SEM) image of Example 1.

FIGS. 4A-C and 5 show microscope images of Example 1. Example 1 has an electrically conductive pattern formed by a plurality of electrically conductive traces on the substrate which define a plurality of open area cells. The electrically conductive traces are formed directly on a selectively roughened region of the substrate. The electrically conductive pattern formed by the electrically conductive traces corresponds to a roughened pattern formed by the selectively roughened region at the major surface of the substrate. The electrically conductive traces have a width of 2 to 3 micrometers. As shown in FIG. 5, an upper surface of the elastically conductive traces includes sub-micrometer features such as the features 26 of FIG. 2K that can diffuse incident light diffusively and reduce the visibility of the electrically conductive pattern on the substrate.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of forming an electrically conductive pattern on a substrate, comprising:
   forming a resist pattern on a resist layer on a major surface of the substrate, the resist pattern including a land region with a reduced thickness;
   selectively roughening a region of the major surface of the substrate, via the resist pattern, to form at least one roughened pattern on the major surface of the substrate; and
   forming one or more electrically conductive traces directly on the roughened region of the major surface of the substrate,
   wherein the electrically conductive traces are in direct contact and conformal with the selectively roughened region of the major surface of the substrate.

2. The method of claim 1, wherein forming the resist pattern is achieved with an embossing process that comprises coating the resist layer on the major surface of the substrate, and urging an embossing tool having a protruded feature into the resist layer to create the land region, the land region corresponding to the protruding feature of the embossing tool.

3. The method of claim 2, further comprising reactive-ion etching the resist layer to remove the land region, form a lift-off mask, and selectively expose the region of the major surface of the substrate underlying the land region.

4. The method of claim 3, wherein selectively roughening the region of the major surface of the substrate comprises continuing the etching to roughen the exposed region of the major surface of the substrate.

5. The method of claim 4, wherein forming the electrically conductive traces comprises depositing at least one metal layer on the resist layer and the roughened region, and removing the lift-off mask along with a portion of the metal layer thereon from the substrate to reveal the electrically conductive pattern on the substrate.

6. The method of claim 2, further comprising heating the resist layer when urging the embossing tool into the resist layer.

7. The method of claim 5, wherein removing the lift-off mask comprises pressure-washing the resist layer.

8. A method of forming an electrically conductive pattern on a substrate with a reduced visibility, comprising:
   providing a resist layer on a major surface of the substrate, the resist layer comprising a resist pattern including a land region, the land region having a reduced thickness;
   etching the resist layer to remove the land region to form a lift-off mask and selectively expose a region of the major surface of the substrate underlying the land region;
   continuing the etching to roughen the exposed region of the major surface of the substrate to form at least one roughened pattern on the major surface of the substrate;
   depositing a metal layer on the resist layer to form a plurality of electrically conductive traces directly on the roughened region of the major surface of the substrate, the plurality of electrically conductive traces being positioned to form the electrically conductive pattern corresponding to the roughened pattern on the major surface of the substrate; and
   removing the lift-off mask along with a portion of the metal layer thereon from the substrate to reveal the electrically conductive pattern on the substrate.

9. The method of claim 8, wherein at least one of the electrically conductive traces has a bottom surface in direct contact with the roughened region of the major surface of the substrate, and a surface morphology of the bottom surface is conformal with the roughened region, such that the bottom surface of the electrically conductive traces is capable of scattering incident visible light to reduce a visibility of the electrically conductive pattern.

10. The method of claim 8, wherein providing the resist layer comprises coating a resist layer on the major surface of the substrate, and thermally embossing, via an embossing tool having a protruding feature, into the resist layer to create the resist pattern, the land region corresponding to the protruding feature of the embossing tool.

11. A method of forming an electrically conductive pattern on a substrate, comprising:
    forming a resist pattern on a resist layer on the major surface of the substrate, wherein forming the resist pattern is achieved with a microreplication process that comprises forming a land region on the resist layer with a reduced thickness, the resist layer being cured by radiation;
    selectively roughening a region of the major surface of the substrate to form at least one roughened pattern on the major surface of the substrate, further comprising; and
    forming one or more electrically conductive traces directly on the roughened region of the major surface of the substrate,
    wherein the electrically conductive traces are in direct contact and conformal with the selectively roughened region of the major surface of the substrate, and
    wherein the electrically conductive traces only contact the substrate on the roughened region, and the electrically conductive traces form the electrically conductive pattern in correspondence with the roughened pattern on the major surface of the substrate.

12. The method of claim 1, wherein the electrically conductive traces only contact the substrate on the roughened region, and the electrically conductive traces form the electrically conductive pattern in correspondence with the roughened pattern on the major surface of the substrate.

13. The method of claim 8, wherein the electrically conductive traces only contact the substrate on the roughened region.

* * * * *